United States Patent
Lu et al.

(10) Patent No.: US 6,747,291 B1
(45) Date of Patent: Jun. 8, 2004

(54) OHMIC CONTACTS ON P-TYPE SILICON CARBIDE USING CARBON FILMS

(75) Inventors: Weijie Lu, Nashville, TN (US); William C. Mitchel, Beavercreek, OH (US); Warren E. Collins, Madison, TN (US); Gerald Landis, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/340,766

(22) Filed: Jan. 10, 2003

(51) Int. Cl.$^7$ .......................... H01L 31/0312
(52) U.S. Cl. ............ 257/77; 257/744; 438/602; 438/931
(58) Field of Search ............ 257/77, 742, 743, 257/744, 745; 438/523, 597, 602, 607, 931

(56) References Cited

U.S. PATENT DOCUMENTS

| | | | |
|---|---|---|---|
| 4,952,902 A | * 8/1990 | Kawaguchi et al. ...... 338/22 R |
| 4,990,994 A | 2/1991 | Furukawa et al. | |
| 5,124,779 A | 6/1992 | Furukawa et al. | |
| 5,323,022 A | 6/1994 | Glass et al. | |
| 5,389,799 A | 2/1995 | Uemoto | |
| 5,409,859 A | 4/1995 | Glass et al. | |
| 6,043,513 A | 3/2000 | Kronlund | |
| 6,096,607 A | 8/2000 | Ueno | |
| 6,139,624 A | * 10/2000 | Rupp ............ 117/2 |
| 6,329,088 B1 | 12/2001 | Landini et al. | |
| 6,383,902 B1 | 5/2002 | Niemann et al. | |
| 6,384,428 B1 | 5/2002 | Oono et al. | |
| 6,599,644 B1 | * 7/2003 | Zekentes et al. ............ 428/627 |

* cited by examiner

Primary Examiner—Sara Crane
(74) Attorney, Agent, or Firm—Gerald B. Hollins; Thomas L. Kundert

(57) ABSTRACT

Ohmic contact formation on p-type Silicon Carbide is disclosed. The formed contact includes an initial amorphous Carbon film layer converted to graphitic sp$^2$ Carbon during an elevated temperature annealing sequence. Decreased annealing sequence temperature, reduced Silicon Carbide doping concentration and reduced specific resistivity in the formed ohmic contact are achieved with respect to a conventional p-type Silicon Carbide ohmic contact. Addition of a Boron carbide layer covering the p-type Silicon Carbide along with the sp$^2$ Carbon is also disclosed. Ohmic contact improvement with increased annealing temperature up to an optimum temperature near 1000° C. is included. Addition of several metals including Aluminum, the optimum metal identified, over the Carbon layer is also included; many other of the identified metals provide Schottky rather than the desired ohmic contacts, however.

18 Claims, 3 Drawing Sheets

US 6,747,291 B1

OHMIC CONTACTS ON P-TYPE SILICON CARBIDE USING CARBON FILMS

CROSS REFERENCE TO RELATED PATENT DOCUMENTS

The present document is somewhat related to the copending and commonly assigned patent document "OHMIC CONTACTS ON n-TYPE SILICON CARBIDE USING CARBON FILMS", Ser. No. 10/340,815 filed of even date herewith. The contents of this related even filing date document are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Silicon Carbide, SiC, is a semiconductor material having a wide band gap, a high saturated electron drift velocity, a high breakdown electric field, good thermal conductivity, and desirable mechanical hardness. Based on these and an additional extraordinary combination of electronic, thermal, and mechanical properties possessed, SiC-based devices have potential for performance superior to the Si or GaAs based devices [1] of current popularity. Parenthetic numbers such as these identify references listed in APPENDIX 1 at the close of this specification. There is a growing demand for electronic components operable under severe conditions for a wide range of military uses, including X-band radar, space radar, vehicle and aircraft power uses, military communications, electronic warfare, and missile applications. SiC-based electronic devices are expected to play a critical role in these applications. For examples, SiC devices have crucial applications in X-band radar for the future "National Missile Defenses" system.

Ohmic contact accomplishment with SiC is presently however a critical issue in achieving successful SiC device fabrications. Ohmic contacts carry electron current into and out of the semiconductor material, ideally with no parasitic resistivity. High performance devices require high quality ohmic contact on SiC. For example, large ohmic contact resistance limits the high frequency performance of SiC devices [2]. It has been determined that contact resistivity to p-type SiC must be reduced to about $10^{-6}$ $\Omega$-cm$^2$ in order to obtain X-band (i.e., 8–12 GHz) performance [2]. The high operating frequency of an X-band radar will for example give the high resolution required for precise tracking and for discrimination of incoming warheads from other objects in the "National Missile Defenses" system. The resistance of ohmic contact on p-type SiC must therefore be reduced by one or two orders of magnitude from that currently obtained [1] and reduced via a manufacturable process.

Another consideration with respect to the use of Silicon Carbide is that ohmic contact on SiC only can be achieved with the use of high temperature annealing, annealing at temperatures near 1000° C., and with SiC having high doping concentration, concentration measuring in the upper $10^{18}$ and $10^{19}$ atoms/cm$^3$ range [3–5]. Such high temperature annealing results in difficulties in the device fabrication, and a high doping concentration can damage the SiC lattice and deteriorate device performance. A significant advance in understanding ohmic contact formation on Silicon Carbide is thus required for many useful additional applications.

P-type Silicon Carbide is available in epitaxial wafer and substrate forms from suppliers to the semiconductor field and at least one supplier of such material is identified in the paragraphs following herein. It is well known however that ohmic contact formation on p-type SiC is more difficult than on n-type SiC [3–5]. A few studies have been performed with respect to ohmic contacts on p-type SiC. Only a few materials, such as Al, Ti/Al, Mo, Ta, W, Pd, W/Pt/Al, Al/Si, CoSi$_2$ and metal borides, are able to form ohmic contact on p-type SiC [6–14]. For such contacts it is usually required that the doping concentration be at the upper $10^{18}$ and $10^{19}$ atoms per cubic centimeter level, and the annealing temperatures be at 1000° C. or above to achieve the contacts. The specific resistivities achieved in these contacts are in the range of $10^{-3}$ to $10^{-5}$ $\Omega$cm$^2$, values greater than those achieved in n-type SiC.

Al has been considered the best material for ohmic contacts on p-type Silicon Carbide [3]. Mo, Ta, and W require the annealing temperatures at 1100–1200° C. [9]. Ta is difficult to adhere on SiC. Pd is easily oxidized, and only stable up to 350° C. in air [10]. The low melting temperature of Al (660° C.) and the oxidation characteristics of Al however make processing contacts involving this metal difficult. Al film also has a very rough surface morphology after annealing. Since the Ti/Al alloy has higher melting temperature than Al, the surface morphology improves using Ti/Al alloy. However, the addition of Ti degrades the contact achieved. Currently, the most commonly used materials for ohmic contacts on p-type Silicon Carbide are Ti/Al alloy [6], and the specific resistivity achieved is at $10^{-5}$ $\Omega$cm$^2$ for SiC with the doping concentration of 1.3×10$^{19}$ cm$^{-3}$, and at $10^{-4}$ $\Omega$cm$^2$ with the doping concentration of 7×10$^{18}$ cm$^{-3}$ after annealing at 1000° C. [6]. The involved mechanism is not well understood. Clearly in this environment there is need for improvement in the state of the Silicon Carbide ohmic contact art. Such improvement is believed provided by the present invention.

SUMMARY OF THE INVENTION

The present invention provides a low electrical resistance ohmic contact with p-type Silicon Carbide semiconductor material.

It is therefore an object of the present invention to provide low electrical resistivity p-type Silicon Carbide ohmic contacts that can be achieved at a lower processing temperature than currently used contact arrangements.

It is another object of the invention to provide a usable p-type Silicon Carbide ohmic contact that is achievable with contact related processing temperatures of 900 degrees Celsius.

It is another object of the invention to provide a p-type Silicon Carbide ohmic contact enabling use of lower Silicon Carbide semiconductor material doping levels than other contact arrangements.

It is another object of the invention to provide a p-type Silicon Carbide ohmic contact in which graphitic sp$^2$ Carbon materials are used to an advantage rather than imposing the usually accepted detrimental effects.

It is another object of the invention to provide an improved Silicon Carbide ohmic contact that is achieved through use of a metallic catalytic agent during contact fabrication.

It is another object of the invention to provide an improved Silicon Carbide ohmic contact that is achieved through use of a aluminum or another metal catalytic agent during contact fabrication.

It is another object of the invention to provide an improved Silicon Carbide ohmic contact achievable with annealing temperatures some two hundred degrees Celsius below those used in present Silicon Carbide device ohmic contact fabrications.

It is another object of the invention to provide an improved Silicon Carbide ohmic contact achievable with semiconductor doping concentrations an order of magnitude below those used in present Silicon Carbide device ohmic contact fabrications.

It is another object of the invention to provide an improved Silicon Carbide ohmic contact through the use of graphitic carbon structures in the contact region.

It is another object of the invention to provide an improved Silicon Carbide ohmic contact achievable through the predictable conversion of an initial form of Carbon into a contact-usable different form of Carbon.

These and other objects of the invention will become apparent as the description of the representative embodiments proceeds.

These and other objects of the invention are achieved by the method of fabricating a graphitic $sp^2$ Carbon-enabled ohmic contact for a p-type Silicon Carbide semiconductor device, said method comprising the steps of:

providing a cleaned surfaced wafer sample of p-type Silicon Carbide having one of selected doping concentration less than $1\times10^{19}$ atoms/cm$^3$ and selected initial resistivity characteristics;

covering said sample cleaned surface with a layer of amorphous $sp^2$ and $sp^3$ Carbon mixture;

supplying a layer of Carbon conversion-accelerating catalytic elemental material over said sample layer of amorphous $sp^2$ and $Sp^3$ Carbon mixture;

converting a substantial portion of said catalytic elemental material layer-covered amorphous $sp^2$ and $sp^3$ Carbon mixture on said sample to elemental material-catalyzed graphitic $sp^2$ Carbon;

said converting step including a heat treating annealing of said sample at a temperature less than 1000° C. but sufficiently high to achieve ohmic contact electrical characteristics between said converted, element material catalyzed graphitic $sp^2$ Carbon and said sample of p-type Silicon Carbide;

disposing an external circuit electrically conductive element in contact with a selected portion of said converted, element material catalyzed graphitic $sp^2$ Carbon.

BRIEF DESCRIPTION OF THE DRAWINGS

The accompanying drawings incorporated in and forming a part of the specification, illustrates several aspects of the present invention and together with the description serve to explain the principles of the invention. In the drawings.

DETAILED DESCRIPTION OF THE INVENTION

Figure 1:
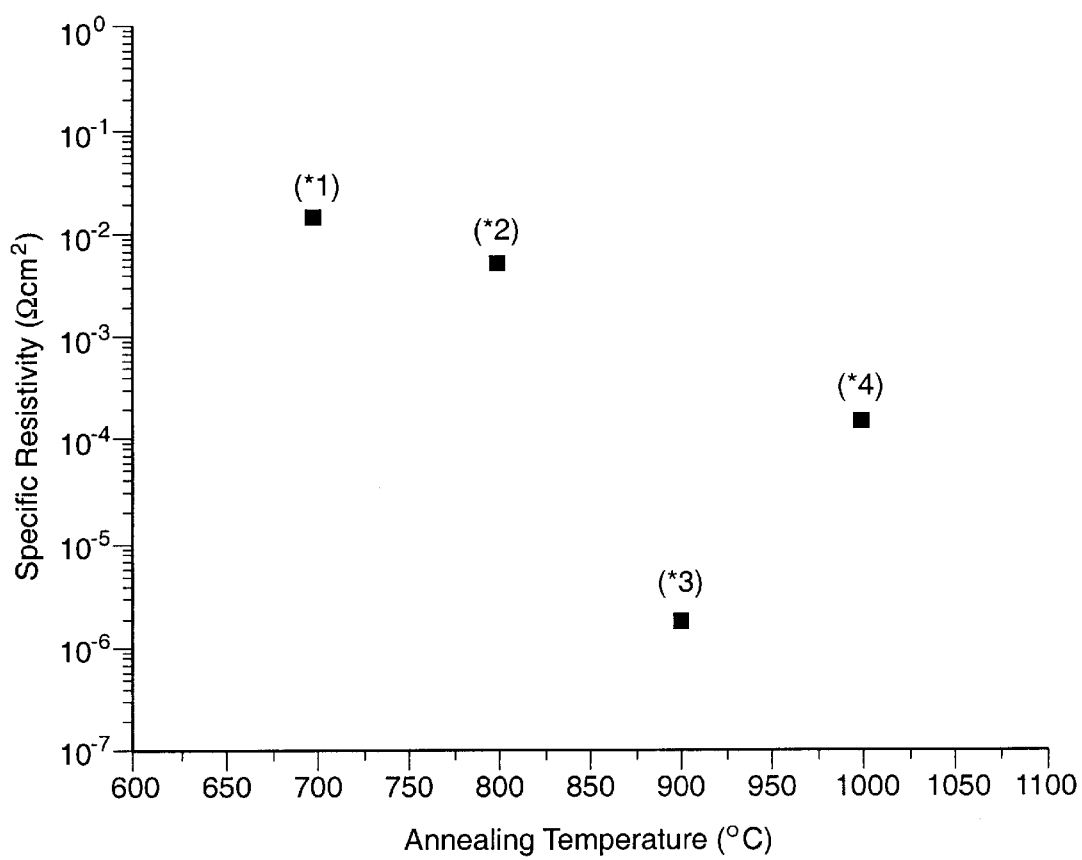
FIG. 1 shows specific resistivities for p-type Ti/Al/C/4H—SiC contact structures after annealing at selected temperatures in Ar.

The present invention is believed fully disclosed by way of the series of Example Ohmic contact formations following.

EXAMPLE 1 THROUGH EXAMPLE 4

Titanium, Aluminum, Graphitized Carbon Contacts on p-type Silicon Carbide

Three p-type SiC wafers from Cree Inc. of Durham, North Carolina, USA are used in Examples 1–4 and other Examples of the invention. The SiC wafers are cut into 8×8 mm squares, and cleaned by the RCA method, a method generally involving the steps of:

a. Immersion in $NH_4OH:H_2O_2:H_2O$(1:1:2) at 85° C. for 5 minutes;

b. Immersion in $HCl:H_2O_2:H_2O$(1:1:2) at 85° C. for 5 minutes;

c. Immersion in $HF:H_2O$ (20% solution) for 5 minutes;

d. Immersion in $HNO_3$ (50%) at 90° C. for 5 minutes;

e. Immersion in $HF:H_2O$ (10% solution) for 2 minutes;

f. Immersion in $CH_3OH$ before metal thin film deposition. Rinse with de-ionized water between each of these steps.

The three wafers used may be identified and characterized as follows:

(a) SiC substrate, p-type, Si face, 8° off axis, and with the resistivity of 0.61 Ωm (b) SiC substrate, p-type, Si face, 8° off axis, and with the resistivity of 1.12 Ωm.

(c) SiC substrate, p-type, Si face, 8° off axis, and with the doping concentration of $7.5\times10^{17}$.

The manner of this characterization, wherein two initial wafer resistivity values are recited for wafers "a" and "b" but a doping concentration is recited for wafer "c", is believed typical of commercial practices observed with respect to p-type Silicon Carbide semiconductor material. In such semiconductor material, wherein Aluminum is a commonly used dopant material, it is found that a doping concentration may exist in the $10^{18}$ and $10^{19}$ range of atoms per cubic centimeter in the SiC wafers "a" and "b" respectively.

TLM (transfer length method) structures from the wafers "a", "b" and "c" may be photolithographically prepared. The size of the rectangular pads in these structures may be 50×100 μm, and the space between pads 25, 50, 75, 100, 125, and 150 μm, respectively. The Ti/Al/C/SiC structures can be prepared by a DC sputtering system (DSM-300A Sputter, Denton Vacuum, Inc.). In this structure the initial carbon film thickness is preferably 5.0 nm, unless otherwise specified, the Al film thickness 150 nm, and the Ti film thickness 50 nm. 500V may be applied for the carbon deposition, and 450V applied for the Al and Ti depositions. The resulting samples may be placed in a graphite furnace (Oxy-Gon Industries, Inc., Epsom, N.H.), and annealed in high purity Ar ($O_2$<1 ppm) at various temperatures for 120 minutes, unless otherwise specified.

Current-voltage characterization of the achieved samples may be performed at room temperature using a MicroManipulator probe station (Model 1800KGS). A Keithley model 220 programmable current source may be used for sample energization, and the drop voltage measured by a Keithley model 195 multimeter.

FIG. 1 in the drawings and the first row of Table 1 in Appendix 2 herein show the achieved specific resistivities for the Ti/Al/C/4H—SiC structures of Examples 1–4, Examples originating with the wafer "a" of 0.61 Ωm original resistivity. The FIG. 1 and Table 1 data is obtained after annealing at various temperatures in Ar for two hours. As shown particularly in Table 1 where both Example and wafer identities appear, after annealing at 700° C., ohmic contact is formed with a specific resistivity of $1.47\times10^{-2}$ Ωcm$^2$. The Table-identified Example numbers also appear in (*X) form in the drawings of this document where X represents an Example identification number. With increasing annealing temperatures, a specific resistivity of $4.85 \times 10^{-3}$ $\Omega cm^2$ is achieved at 800° C., and $1.61 \times 10^{-6}$ $\Omega cm^2$ is achieved after 900° C. in Examples 1–4. The specific resistivity increases however to $1.26 \times 10^{-4}$ $\Omega cm^2$ after annealing at 1000° C.; this occurrence suggesting the presence of an optimum annealing temperature somewhere below 1000° C.

EXAMPLE 5 THROUGH EXAMPLE 9

Doping Concentration Variation

The lower two rows of Table 1 list the specific resistivities of Ti/Al/C/SiC achieved on lightly doped SiC samples taken from wafers "b" and "c" after annealing at various temperatures in Ar for two hours. One SiC sample with the resistivity of 1.12 $\Omega m$ (achieved by doping in the lower $10^{18}$ $cm^{-3}$ range) and another SiC sample with doping concentration of $7.5 \times 10^{17}$ $cm^{-3}$ are involved and the achieved ohmic contacts identified as Examples 5 through 9 in Table 1. As shown, ohmic contact is formed on SiC with the resistivity of 1.12 $\Omega m$ at 800° C., and is formed at 900° C. on the SiC of $7.5 \times 10^{17}$ $cm^{-3}$ doping. In Examples 5 through 9 the best ohmic contacts are formed on the SiC samples after annealing at 900° C.; this Example, Example 6, provides the specific resistivity of $3.12 \times 10^{-4}$ $\Omega cm^2$. With annealing at 1000° C., the specific resistivity increases slightly to $7.29 \times 10^{-4}$ $\Omega cm^2$ and $1.03 \times 10^{-3}$ $\Omega cm^2$, respect Examples 8 and 9. The values of specific resistivities in these Examples on 4H—SiC are similar to those of Ti/Al film on 6H—SiC [8]. However, since the band gap of 6H—SiC (3.0 eV) is smaller than 4H—SiC (3.3 eV), the addition of a carbon film according to the present invention shows an improvement in ohmic contact formation.

Our results with ohmic contacts for n-type C/SiC for and metal/carbon on n-type SiC have shown the formation of nano-graphitic flakes plays a determinative role in ohmic contact formation, and metals as graphitization catalysts accelerate the process [16–20]. In p-type SiC, the carbon graphitization process appears to play an important role in ohmic contact formation, which is the same as with n-type SiC. Both Al and Ti are good graphitization catalysts [24, 25]. However, Al reacts with SiC to form $Al_4C_3$ [21], and $Al_4C_3$ is thermally stable up to the temperature of 1370° C. [22]; thus the decomposition products described with respect to n-type Silicon Carbide in the identified companion patent document are not present in the present p-type Silicon Carbide instance where temperatures of 1000° C. and below are described. Ti reacts with SiC to form TiC and Ti silicides [23]. The high thermal stability of the Al and Ti catalysts decreases the effectiveness of Al and Ti as graphitization catalysts. This explains the fact that the improvement in ohmic contacts with the Ti/Al/C/SiC structures for for p-type SiC is not as significant as for the Ni/C structures on n-type SiC [20]. However as in the discussion in the next paragraph, the addition of a carbon interface layer between Ti/Al film and SiC improves ohmic contacts, and indicates that some degree of catalytic graphitization takes place in the present p-type Ti/Al/C/SiC structures. Several of the Table 1 lower temperature-annealed samples provide non-ohmic contact characteristics and are therefore not identified with Example numbers herein.

A pair of Ti/Al/SiC and Ti/Al/C/SiC samples, resulting in Examples 10 and 11 herein, also are examined after annealing at 900° C. with the same preparation and annealing conditions as specified above in connection with Examples 1 through 4. The specific resistivities achieved with these samples are $4.3 \times 10^{-6}$ $\Omega cm^2$ for the Ti/Al/C/SiC of Example 10 and $2.38 \times 10^{-4}$ $\Omega cm^2$ for the Example 11 Ti/Al/SiC sample. This data clearly shows that an additional carbon layer in the SiC contact interface improves ohmic contacts on p-type Silicon Carbide.

By way of comparison in the conventional p-type Ti/Al/ SiC contact structures, ohmic contact characteristics are obtained after annealing at 800° C. [ 15] and the optimal annealing temperature for ohmic contact formation is 1000° C. [6–8]. With an additional carbon interfacial layer as provided in the present invention, ohmic contacts are formed at 700° C. (Example 1 in Table 1) and the optimal annealing temperature decreases to 900° C. in the Ti/Al/C/SiC structure as shown by the results of Example 3 in Table 1 where the excellent ohmic contact ($1.61 \times 10^{-6}$ $\Omega cm^2$) is obtained after annealing at 900° C. Therefore, we conclude that a carbon interfacial film and the ensuing post anneal graphitic layer on p-type SiC provides an improvement with respect to ohmic contact formation.

EXAMPLES 12 THROUGH 16

Carbon Film Thickness Variations

Figure 2:
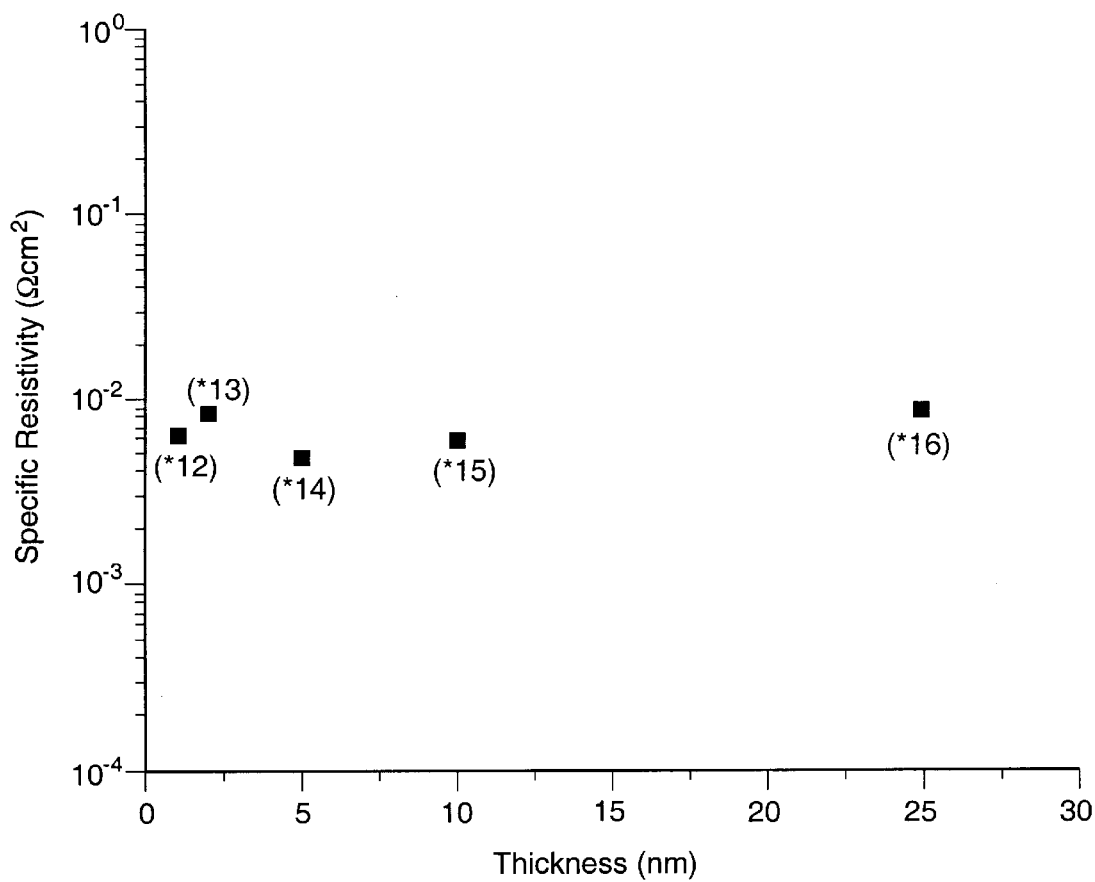
FIG. 2 shows specific resistivities for p-type Ti/Al/C/4H—SiC contact structures of selected Carbon thickness after annealing at 800° C. in Ar.

FIG. 2 in the drawings herein shows the specific resistivities resulting from Ti/Al/C/SiC structures having various initial Carbon thickness after annealing at 800° C. in Ar for two hours. The FIG. 2 data points are identified with Example numbers. The initial thickness of the FIG. 2 carbon films are 1.0, 2.0, 5.0, 10.0, and 25.0 nm, respectively for Examples 12 through 16. These Examples originate in the same wafer "a" described above in connection with Examples 1 through 4. As shown in FIG. 2 the achieved specific resistivities range from $5 \times 10^{-3}$ to $9 \times 10^{-3}$ $\Omega cm^2$. Since the Al based film has coarse morphology after thermal annealing accurate resistivity measurement is somewhat difficult, however we conclude from the results shown that the initial thickness of the interfacial carbon film has no significant effects on ohmic contact formation.

EXAMPLES 17 THROUGH 20

Annealing Time Variations

Figure 3:
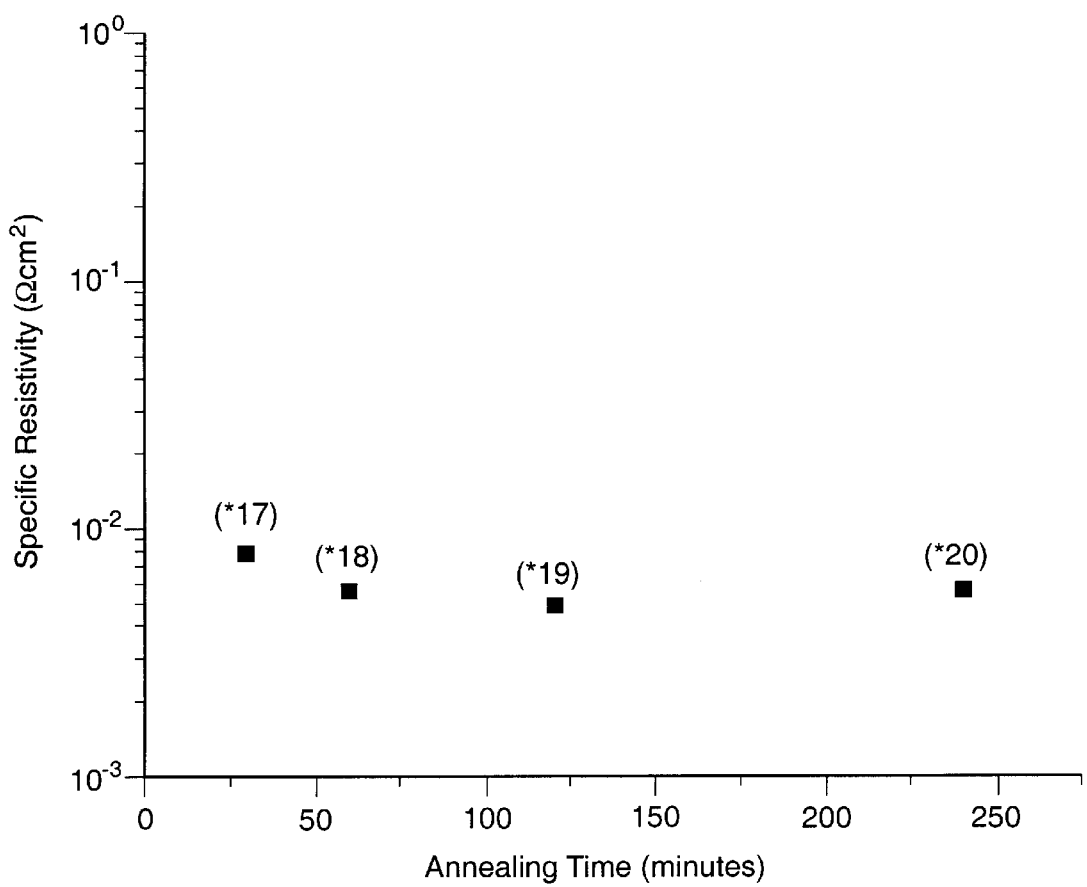
FIG. 3 shows specific resistivities for p-type Ti/Al/C/4H—SiC contact structures after annealing at 800° C. in Ar for selected time intervals.

FIG. 3 in the drawings shows the specific resistivities of Ti/Al/C/SiC structures obtained with various annealing times after annealing at 800° C. in Ar for two hours. The annealing times represented are 30, 60, 120, and 240 minutes and these times are identified as Examples 17, 18, 19 and 20 in FIG. 3. As shown, the specific resistivities achieved with these different annealing times are all in the order of $10^{-3}$ $\Omega cm^2$. The specific resistivity with the annealing time of 30 minutes is slightly larger than those with longer annealing times.

EXAMPLES 21 THROUGH 26

Ohmic Contacts Using Boron Carbide Film

Different portions of the above identified wafers "a" and "b", p-type SiC wafers from Cree Inc. are used for these Examples. These wafer portions can also be cut into 8×8 $mm^2$ size samples, and cleaned by the RCA method as described above. The detailed information for each of the two wafers, "a" and "b", is as shown above:

(a) SiC substrate, p-type, Si face, 80 off axis, and with the resistivity of 0.61 $\Omega m$ (b) SiC substrate, p-type, Si face, 8° off axis, and with the resistivity of 1.12 $\Omega m$.

The TLM (transfer length method) structures for the present Examples can be photolithographically prepared from these wafer portions. The size of the rectangular pads may be 50×100 μm, and the space between pads made 25, 50, 75, 100, 125, and 150 μm, respectively. B$_4$C/SiC, M/B$_4$C/SiC, and M/C/B$_4$C/SiC structures may be prepared by using a DC sputtering system (DSM-300A Sputter, Denton Vacuum, Inc.) to add B$_4$C film to the wafer "a" and "b" portions. In the B$_4$C/SiC structures of Example 21, the B$_4$C film thickness is 50.0 nm, and the SiC wafer "b" material is used. In the M/B$_4$C/SiC and M/C/B$_4$C/SiC structures, the B$_4$C and carbon film thickness are 5.0 nm each, the metal film thickness is 200 nm, and the SiC wafer "b" material is used. Eight metals are added to the B$_4$C film as are identified in Table 2; these metals include Al, Co, Cr, Mo, Ni, Ti, Ta, and W. A potential of 500 volts is applied for each carbon and B$_4$C deposition, and 450 Volts is applied for each metal deposition.

The samples are placed in a graphite furnace (Oxy-Gon Industries, Inc., Epsom, N.H.), and annealed in high vacuum ($10^{-5}$–$10^{-6}$ Torr) at 900 and 1000° C. temperatures for 60 minutes, unless specified. Current-voltage characterization of the samples are performed at room temperature using a MicroManipulator probe station (Model 1800KGS). A Keithley 220 supply is used as current source, and the drop voltage measured by a Keithley 195 instrument.

B$_4$C film on p-type SiC shows ohmic contact characteristics after thermal annealing. For the wafer "a" p-type SiC material with resistivity of 0.61 Ωm, ohmic contact is formed after annealing at 1350° C. in Ar for 30 minutes. The specific resistivity achieved for this Example 21 material is greater than desired, at 2.41×10$^{-2}$ Ωcm$^2$, with the thickness of B$_4$C film at 50 nm. B$_4$C is thermally stable in air up to 600° C. therefore use of B$_4$C as ohmic contact material has advantages for applications of higher temperature devices. The electrical contact behavior of B$_4$C/SiC samples exhibit Schottky contact characteristics in the annealing temperatures ranges from 1050° C. to 1250° C.; this however converts to ohmic contact with annealing at 1350° C. This is similar to characteristics of C/SiC samples [16]. The results recited are believed to discover B$_4$C as a new material for ohmic contacts on p-type SiC.

In order to achieve lower resistivity ohmic contacts involving B$_4$C, ohmic contact combinations of metal and B$_4$C may be considered; specifically the combinations M/B$_4$C/SiC and M/C/B$_4$C/SiC are of interest. Eight metals, Al, Co, Cr, Mo, Ni, Ti, Ta, and W, are considered here and are described in Table 2. The Table 2 SiC is p-type, Si face, 8° off axis, with the resistivity of 1. 12 Ωm i.e., material from wafer "b" described above. As shown in Table 2 Al/B$_4$C/SiC exhibits ohmic contacts with the specific resistivity of 8.13×10$^{-4}$ and 1.89×10$^{-4}$ Ωcm$^2$ after annealing at 1000° C. and 1100° C. in vacuum for 60 minutes. Ni/B$_4$C/SiC shows poor ohmic contact behavior. Six other samples, Co/B$_4$C/SiC, Cr/B$_4$C/SiC, Mo/B$_4$C/SiC, Ti/B$_4$C/SiC, Ta/B$_4$C/SiC, and W/B$_4$C/SiC achieve Schottky contacts rather than ohmic contacts after annealing at 1000° C. and 1100° C. in vacuum for 60 minutes.

As shown in Example 25 of Table 2 therefore Al/C/B$_4$C/SiC achieves excellent ohmic contact with p-type Silicon Carbide after annealing at 1000° C. in vacuum for 60 minutes. This contact provides the specific resistivity of 1.56×10$^{-5}$ Ωcm$^2$. The Ni/C/B$_4$C/SiC of Example 24 in Table 2 however achieves poor ohmic contact behavior. Six other samples, Co/C/B$_4$C/SiC, Cr/C/B$_4$C/SiC, Mo/C/B$_4$C/SiC, Ti/C/B$_4$C/SiC, Ta/C/B$_4$C/SiC, and W/C/B$_4$C/SiC provide Schottky contacts after annealing at 1000° C. in vacuum for 60 minutes and are thus not identified as Examples herein. Since the specific resistivity of Ti/Al/C/SiC on the same wafer with 1000° C. annealing is 7.29×10$^{-4}$ Ωcm$^2$, as shown in Table 1 we conclude the addition of carbon in the Al/C/B$_4$C/SiC combination provides the best structure for ohmic contact on p-type SiC.

The Ti/Al/C/SiC structures disclosed herein therefore decrease the annealing temperature for p-type Silicon Carbide ohmic contact formation by about 100–200° C. in comparison with the conventional ohmic contact formation technique. The structures achieved also reduce the fabricated contact resistivity by one order of magnitude. The optimal annealing temperature for Ti/Al/C/SiC structures is found to be 900° C., while a higher temperature annealing at 1000° C. results in the best ohmic contact in the conventional Ti/Al/SiC structures. Excellent ohmic contact can therefore be formed on p-type SiC with a one order lower doping concentration than in the conventional contact fabrication technique. A new material, B$_4$C, is disclosed for use in ohmic contacts on p-type SiC with metal/carbon/B$_4$C/SiC structures. This technology is believed usable to improve the performance of high power and high frequency Silicon Carbide devices, and provide more flexibility in device fabrications.

The foregoing description of the preferred embodiment has been presented for purposes of illustration and description. It is not intended to be exhaustive or to limit the invention to the precise form disclosed. Obvious modifications or variations are possible in light of the above teachings. The embodiments are chosen and described to provide the best illustration of the principles of the invention and its practical application to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

APPENDIX 1

References (Each Document is Hereby Incorporated by Reference Herein)

[1] R. J. Trew, "*Semiconductors and Semimetals*", edited by Y. S. Park (Academic Press, San Diego, Calif., 1998), Vol.52, Chap.6, p237.

[2] G.-B. Gao, J. Sterner, and H. Morkoc, *IEEE Trans. Electron Dev.*, 41, 1092 (1994).

[3] L. M. Porter, and R. F. Davis, *Mater. Sci. & Engin.*, B34, 83 (1995).

[4] V. Saxena, and A. J. Steckl, "*Semiconductors and Semimetals*", edited by Y. S. Park (Academic Press, San Diego, Calif., 1998), Vol.52, Chap.3, p77.

[5] J. Crofton, L. M. Porter, and J. R. Williams, *Phys. Stat. Sol.*(b), 202, 581 (1997).

[6] J. Crofton, S. E. Mohney, J. R. Williams, and T. Isaacs-Smith, Solid-State Electronics, 46, 109 (2002).

[7] J. Crofton, L. Beyer, J. R. Williams, E. D. Luckowski, S. E. Mohney, and J. M. Delucca, Solid-State Electronics, 41, 1725 (1997).

[8] J. Crofton, P. A. Barnes, J. R. Williams, and J. A. Edmond, Appl. Phys. Lett., 62, 384 (1993).

[9] J. O. Olowolafe, J. Liu, and R. B. Gregory, J. Electr. Mater., 29, 391 (2000).

[10] L. Kassamakova, R. D. Kakanakov, I. V. Kassamakov, N. Nordell, S. Savage, B. Hjörvarson, E. B. Svedberg, L. Åbom, and L. D. Madesen, IEEE Trans on Electron Dev., 46, 605 (1999).

[11] N. Lundberg, and M. Östling, *Solid-State Electronics*, 39, 1559 (1996).

[12] R. D. Kakanakov, L. Kassamakova, I. V. Kassamakov, K. Zekentes, and N Kuznetsov, Mater. Sci. & Engin., B80, 374 (2001).

[13] T. N. Oder, J. R. Williams, S. E. Mohney, and J. Crofton, J. Electr. Mater., 27, 12 (1998).
[14] S.-K. Lee, C.-M. Zettering, M. Östling, J.-P. Palmquist, H. Högberg, and J. Jansson, Solid State Electronics, 44, 1179 (2000).
[15] N. A. Papanicolaou, A. Edwards, M. V. Rao, and W. T. Anderson, Appl. Phys. Lett., 73, 2009 (1998).
[16] "Ohmic Contac Behavior of Carbon films on SiC", Weijie Lu, W. C. Mitchel, Candis A. Thornton, W. Eugene Collins, G. Landis, and S. R. Smith, accepted by, J. Electrochem Soc.
[17] "Structures and Ohmic Contact of Carbon Film on 4H—SiC", Weijie Lu, W. C. Mitchel, Candis A. Thornton, G. R. Landis, and W. Eugene Collins, to be submitted.
[18] "Electrical Contact Behavior of Ni/C60/4H—SiC", Weijie Lu, W. C. Mitchel, J. R. Landis, T. R. Crenshaw, and W. Eugene Collins, to be published in J. Vac. Sci. & Tech. B.
[19] "Metal Catalytic Graphitization Activities and Ohmic Contact Formation on 4H—SiC", Weijie Lu, W. C. Mitchel, G. R. Landis, T. R. Crenshaw, and W. Eugene Collins, to be submitted to J. Appl. Phys.
[20] "Ohmic Contact Properties of Ni/C Film on 4H—SiC", Weijie Lu, W. C. Mitchel, G. R. Landis, T. Crenshaw, and W. Eugene Collins, to be submitted.
[21] Ts. Marinova, R. Yakimova, V. Krastev, C. Hallin, and E. Janzen, *J. Vac. Sci. Technol.* B 14 (5), 3252 (1996).
[22] CRC Handbook of Chemistry and Physics, 64$^{th}$ edition, CRC Press, Boca Ration, Flo., 1983, p. D-51.
[23] F. Goesmann, and R. Schmid-Fetzer, *Semicond. Sci. Technol.* 10, 1652 (1995).
[24] A. Oya and H. Marsh *J. Matter Sci.*, 17, 309 (1982)
[25] A. Oya and S. Otani, *Carbon*, 17, 131 (1979)

APPENDIX 2

Data Tables

We claim:

1. The method of fabricating a graphitic $sp^2$ Carbon-enabled ohmic contact for a p-type Silicon Carbide semiconductor device, said method comprising the steps of:
   providing a cleaned surfaced wafer sample of p-type Silicon Carbide having a selected doping concentration of up to $1 \times 10^{19}$ atoms/cm$^3$ and selected initial resistivity characteristics;
   covering said sample cleaned surface with a layer of amorphous $sp^2$ and $sp^3$ Carbon mixture;
   supplying a layer of Carbon conversion-accelerating catalytic elemental material over said sample layer of amorphous $sp^2$ and $sp^3$ Carbon mixture;
   converting a substantial portion of said catalytic elemental material layer-covered amorphous $sp^2$ and $sp^3$ Carbon mixture on said sample to elemental material-catalyzed graphitic $sp^2$ Carbon;
   said converting step including a heat treating annealing of said sample at a temperature less than 1000° C. but sufficiently high to achieve ohmic contact electrical characteristics between said converted, element material catalyzed graphitic $sp^2$ Carbon and said sample of p-type Silicon Carbide; and
   disposing an external circuit electrically conductive element in contact with a selected portion of said converted, element material catalyzed graphitic $sp^2$ Carbon.

2. The method of fabricating a graphitic $sp^2$ Carbon-inclusive ohmic contact for an p-type Silicon Carbide semiconductor device of claim 1 wherein said carbon layer in said step of covering said sample cleaned surface with a layer of amorphous $sp^2$ and $sp^3$ Carbon mixture comprises a thickness of five nanometers.

3. The method of fabricating a graphitic $sp^2$ Carbon-inclusive ohmic contact for an p-type Silicon Carbide semiconductor device of claim 1 wherein said step of supplying a Carbon conversion-accelerating catalytic element material

TABLE 1

Specific Resistivities of Ti/Al/C/SiC Structures at Various Annealing Temperatures in Argon for Two Hours

| Annealing Temperature (° C.) | 700 | 800 | 900 | 1000 |
|---|---|---|---|---|
| p-type, Si face, 8° off axis, and the resistivity of 0.61Ωm "a" | $1.47 \times 10^{-2}$ *1 | $4.85 \times 10^{-3}$ *2 | $1.61 \times 10^{-6}$ *3 | $1.26 \times 10^{-4}$ *4 |
| p-type, Si face, 8° off axis, and the resistivity of 1.12Ωm "b" | Not ohmic | 0.110 *5 | $3.12 \times 10^{-4}$ *6 | $7.29 \times 10^{-4}$ *7 |
| p-type, Si face, 8° off axis, and the doping $7.5 \times 10^{17}$ "c" | Not ohmic | Not ohmic | $9.56 \times 10^{-4}$ *8 | $1.03 \times 10^{-3}$ *9 |

*Designates Example Number in Table 1 Data

TABLE 2

Specific Resistivities of M/C/B$_4$C/SiC and M/B$_4$C/SiC Structures After Annealing in Vacuum for 60 Minutes (p-type, Si Face, 8° Off Axis, and With Resistivity of 1.12 Ωm, Wafer "b")

| | Al | Co | Cr | Mo | Ni | Ta | Ti | W |
|---|---|---|---|---|---|---|---|---|
| M/B$_4$C/SiC at 1000° C. | 8.13e-4 *22 | Not ohmic | Not ohmic | Not ohmic | Not ohmic | Not ohmic | Not ohmic | Not ohmic |
| M/B$_4$C/SiC at 1100° C. | 1.89e-4 *23 | Not ohmic | Not ohmic | Not ohmic | 0.130 *24 | Not ohmic | Not ohmic | Not ohmic |
| M/C/B$_4$C/SiC at 1000° C. | 1.56e-5 *25 | Not ohmic | Not ohmic | Not ohmic | 0.170 *26 | Not ohmic | Not ohmic | Not ohmic |

*Designates Example Number in Table 2 Data layer over said sample layer of amorphous sp² and sp³ Carbon mixture comprises covering said layer of amorphous sp² and sp³ Carbon mixture with a metallic layer.

4. The method of fabricating a graphitic sp² Carbon-inclusive ohmic contact for an p-type Silicon Carbide semiconductor device of claim 3 wherein said step of covering said layer of amorphous sp² and sp³ Carbon mixture with a metallic layer comprises covering said layer of amorphous sp² and sp³ Carbon mixture with a layer of Aluminum.

5. The method of fabricating a graphitic sp² Carbon-inclusive ohmic contact for an p-type Silicon Carbide semiconductor device of claim 1 further including the step of testing said Carbon-enabled contact for ohmic contact characteristics and specific resistivity of $10^{-5}$ ohm-centimerter² and lower resistivity values.

6. The method of fabricating a graphitic sp² Carbon-inclusive ohmic contact for an p-type Silicon Carbide semiconductor device of claim 1 wherein said clean surfaced wafer sample of p-type Silicon Carbide having selected doping concentration less than $1 \times 10^{19}$ atoms/cm³ comprises a Silicon faced eight degrees off axis Silicon Carbide sample.

7. The method of fabricating a graphitic sp² Carbon-inclusive ohmic contact for a p-type Silicon Carbide semiconductor device of claim 1 wherein said steps of covering and supplying each include a direct current sputtering sequence.

8. The method of fabricating a graphitic sp² Carbon-inclusive ohmic contact for a p-type Silicon Carbide semiconductor device of claim 1 wherein said converting step is performed in one of a vacuum and an argon sample-surrounding atmosphere.

9. The method of fabricating a graphitic sp² Carbon-inclusive ohmic contact for a p-type Silicon Carbide semiconductor device of claim 1 wherein:

said step of supplying a pair of Carbon conversion-accelerating catalytic elemental material layers over said sample layer of amorphous sp² and Sp³ Carbon mixture comprises covering said layer of amorphous sp² and sp³ Carbon mixture with a layer of Boron; and said step of converting said layer of Carbon includes reacting said Boron into a Boron Carbide compound.

10. The method of fabricating a graphitic sp² Carbon-inclusive ohmic contact for a p-type Silicon Carbide semiconductor device of claim 1 wherein said converting step includes a heat treating annealing of said sample at a temperature between 700° C. and 1000° C.

11. The method of fabricating a graphitic sp² Carbon-inclusive ohmic contact for a p-type Silicon Carbide semiconductor device of claim 1 wherein said converting step includes a heat-treating annealing of said sample at a temperature providing minimum electrical specific resistivity in an achieved ohmic contact.

12. The p-type Silicon Carbide nano-sized graphitic flake ohmic contact apparatus comprising the combination of:

a wafer sample of p-type Silicon Carbide of Aluminum impurity doping concentration between $1 \times 10^{17}$ and $1 \times 10^{19}$ atoms per cubic centimeter;

a layer of different element-catalyzed sp² Carbon and graphitic sp² Carbon overlaying said wafer sample of p-type Silicon Carbide in selected contact areas thereof;

said layer of different element-catalyzed graphitic sp² Carbon in said selected contact areas including a post annealing remainder sub-layer of inter-diffused Sp2 Carbon and said different element molecules; and an external signal-communicating electrical conductor connected with one of said layer of different element-catalyzed graphitic sp² Carbon and said post annealing remainder sub-layer of inter-diffused Carbon and different element molecules on said wafer sample of p-type Silicon Carbide.

13. The p-type Silicon Carbide graphitic sp² Carbon ohmic contact apparatus of claim 12 wherein said different element in said layer of different element-catalyzed graphitic sp² Carbon overlaying said wafer sample of p-type Silicon Carbide is comprised of the element Aluminum.

14. The p-type Silicon Carbide graphitic sp² Carbon ohmic contact apparatus of claim 12 wherein said different element in said layer of different element-catalyzed graphitic sp² Carbon overlaying said wafer sample of p-type Silicon Carbide is comprised of the element Boron.

15. The p-type Silicon Carbide graphitic Sp² Carbon ohmic contact apparatus of claim 12 wherein said layer of different element-catalyzed graphitic sp² Carbon has an initial pre annealing thickness between 5 and 50 nanometers.

16. The p-type Silicon Carbide ohmic contact comprising the combination of:

a layer of annealed Silicon Carbide semiconductor material; and a layer of annealed Boron Carbide overlaying said layer of annealed Silicon Carbide material in ohmic contact therewith.

17. The p-type Silicon Carbide ohmic contact of claim 16 further including one of the metals of Aluminum and Nickel.

18. The p-type Silicon Carbide ohmic contact of claim 16 wherein said ohmic contact is comprised of the materials Aluminum, Carbon, Boron Carbide and Silicon Carbide each in annealed form.

* * * * *